SEMICONDUCTOR DEVICE FABRICATION

Filed Sept. 10, 1964 2 Sheets-Sheet 1

INVENTOR.
HANS P. KLEINKNECHT
BY
W. S. Hill
AGENT

SEMICONDUCTOR DEVICE FABRICATION

Filed Sept. 10, 1964 2 Sheets-Sheet 2

INVENTOR.
HANS P. KLEINKNECHT
BY
W. S. Hill
AGENT

United States Patent Office 3,301,716
Patented Jan. 31, 1967

3,301,716
SEMICONDUCTOR DEVICE FABRICATION
Hans P. Kleinknecht, Bergdietikon, Aargau, Switzerland, assignor to Radio Corporation of America, a corporation of Delaware
Filed Sept. 10, 1964, Ser. No. 395,420
14 Claims. (Cl. 148—1.5)

Figure 1:
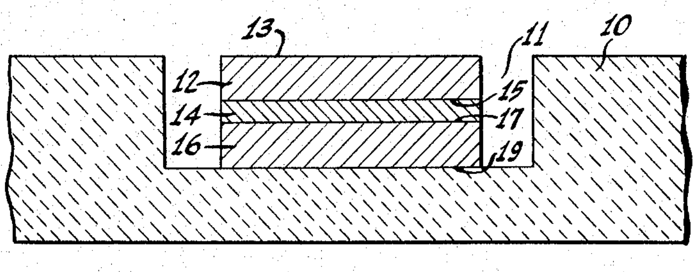

This invention relates to improved methods of fabricating improved semiconductor devices such as transistors and the like.

It is known that when a sandwich consisting of a molten solvent metal layer between two crystalline semiconductive layers is placed in a furnace arranged to provide a temperature gradient perpendicular to the sandwich plane, so that one semiconductive layer is hotter than the other semiconductive layer, the molten metal layer will move through the hotter semiconductive layer toward the hot side of the sandwich. See, for example, W. G. Pfann, Temperature Gradient Zone Melting, Journal of Metals, September 1955, page 961. The movement of the molten solvent metal zone in a thermal gradient is explained as due to the continuous dissolution of semiconductive material at the solid-liquid phase boundary on the hot side of the molten metal zone, diffusion of this dissolved semiconductive material through the molten zone to the colder side of the molten zone, and precipitation of the semiconductive material at the liquid-solid phase boundary on the cold side of the molten zone. The precipitated or recrystallized semiconductive material contains some of the solvent metal, and also contains some of any impurity present in the solvent metal. The impurity may be some undesired substance which is accidentally present in the solvent metal. Alternatively, the impurity may be a conductivity type modifier, that is, an acceptor or a donor which has been deliberately added to the solvent metal in controlled amounts.

Since the temperature gradient zone-melting technique generally results in high conductivity central zones which are crystallographically imperfect and have short minority carrier lifetime, this technique has not hitherto been satisfactory for the production of many transistors. However, for some special purpose devices, a heavily doped base region can be tolerated, or may even be desired. The formation of satisfactory thin heavily doped layers within a crystalline semiconductive wafer or die has been difficult to achieve by the standard methods of the prior art, such as diffusion or alloying.

For other special purpose devices, it is desirable to unite a layer of one crystalline semiconductive material with a layer of a different crystalline semiconductive material. The fabrication of such devices, which are known as heterojunction devices when there is a rectifying barrier between the two layers, has been difficult to achieve by prior art methods.

It is an object of this invention to provide an improved method of fabricating improved semiconductor devices.

Another object of the invention is to provide an improved method of fabricating junction transistors with high conductivity central base layers.

Still another object of the invention is to provide an improved method of utilizing a thermal gradient to fabricate semiconductor junction devices with thin heavily doped central layers.

But another object is to provide an improved method of bonding a layer of one crystalline semiconductive material to a layer of a different crystalline semiconductive material.

These and other objects are attained according to the invention by providing a sandwich consisting of a layer of metallic material bonded between two layers of semiconductive material. The metallic layer advantageously is selected from those materials which have a melting point lower than that of the semiconductor layers, and are capable, when molten, of dissolving a portion of said semiconductive layers. The sandwich is subjected to a temperature differential between two ends thereof, so that a thermal gradient is established in the sandwich in a direction parallel to the sandwich plane. The sandwich is maintained at a temperature above the melting point of the metallic layer but below the melting point of the semiconductive layers while the thermal gradient is applied for a period of time sufficient for the metallic layer to move through the sandwich and collect at the hot end thereof.

Figure 7:
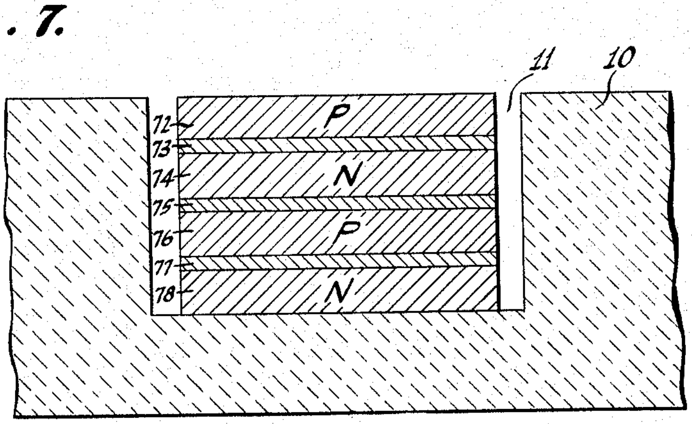
Figure 8:
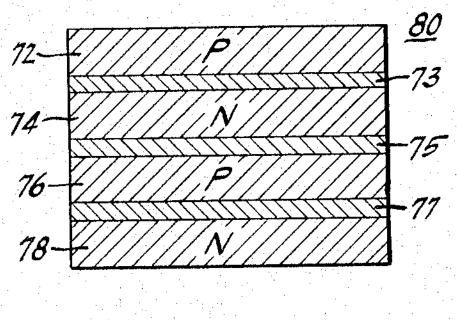
Figure 9:
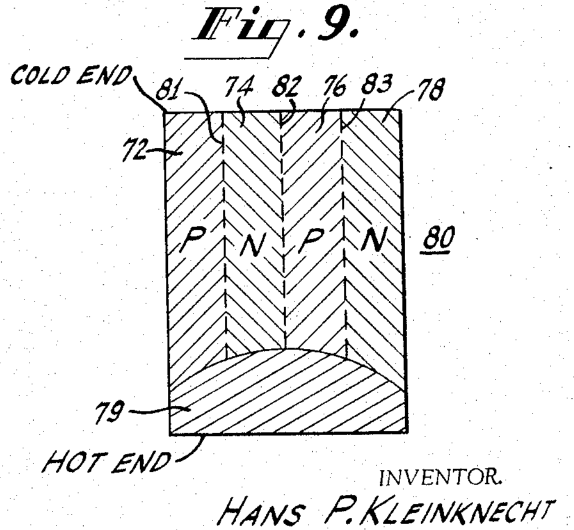

The invention and its features will be described in greater detail in the following example, considered in conjunction with the accompanying drawing, in which:

FIGURES 1–6 are cross-sectional views of layers of material illustrating successive steps embodying the invention in the fabrication of a semiconductor device; and FIGURES 7–9 are cross-sectional views of layers of material and illustrating successive steps according to another embodiment of the invention.

*Example I*

Two layers 12 and 16 (FIGURE 1) of crystalline semiconductive material are positioned against opposing faces of a layer 14 of metallic material. The crystalline semiconductive material utilized may consist of an elemental semiconductor, such as silicon, germanium, and the like, or a semiconductive alloy, such as silicon-germanium alloys, or a compound semiconductor, such as the phosphides, arsenides and antimonides of aluminum, gallium and indium, which are known as the III–V compounds. In this example, the semiconductive layers 12 and 16 consist of indium arsenide. The exact size, shape and conductivity type of semiconductive layers 12 and 16 is not critical. Conveniently, semiconductive layers 12 and 16 may be in the form of flat dies or platelets. In this example, the semiconductive layer 12 has two opposing major faces 13 and 15, consists of P conductivity type monocrystalline indium arsenide, and is in the form of a die or wafer about 60 mils square and 40 mils thick. The semiconductive layer 16 similarly is a die having two flat opposing major faces 17 and 19, and is of the same shape and material as die 12.

The two semiconductive dies 12 and 16 are positioned across opposing faces of a metallic layer 14 so as to contact the metallic layer. The metallic layer 14 may consist of a single metal which is a conductivity modifier in the semiconductive layers, i.e., either an acceptor or a donor. Alternatively, metallic layer 14 may be a mixture or alloy including a substance which is a conductivity modifier in the particular semiconductor utilized for layers 12 and 14. According to another embodiment described below, the metallic layer 14 consists of a solvent metal only, and is electrically neutral with respect to the conductivity type of the semiconductor layers. In each case, metallic layer 14 is selected from those metals and alloys which have a melting point lower than the particular semiconductor utilized for wafers 12 and 16, and which metals and alloys when molten, are capable of dissolving a portion of the adjacent semiconductor layers. The precise size and shape of metallic layer 14 is not critical. In this example, metallic layer 14 consists of 90 atomic percent indium–10 atomic percent tellurium, and is about 60 mils square and 2 mils thick. The indium arsenide semiconductive layers 12 and 16 melt at about 940° C., while the 90 indium–10 tellurium layer 14 melts at about 420° C.

The two semiconductive dies 12 and 16 are positioned in contact with opposite sides of metallic layer 14 and are placed in an aperture 11 within a jig 10, which suitably consists of a refractory material such as graphite. The assemblage is then heated in a non-oxidizing ambient for a time and temperature sufficient to bond the three layers into a single composite structure in the form of a sandwich having a metallic layer between two semiconductive layers. The non-oxidizing ambient utilized may consist of an inert gas such as argon, or a reducing gas such as pure dry hydrogen, or a vacuum.

The temperature required to bond the three layers into a single sandwich is one which is above the melting point of the metallic layer but below the melting point of the semiconductor layers. In this example, the assemblage is heated in a hydrogen ambient for about 5 minutes at about 650° C. During this heating step the assemblage of three layers may be pressed together by means of a clamp (not shown), or by placing a weight (not shown) on the uppermost surface of one semiconductive die. After the assemblage has been bonded to form a sandwich, it is cooled to room temperature in the same non-oxidizing ambient.

Figure 2:
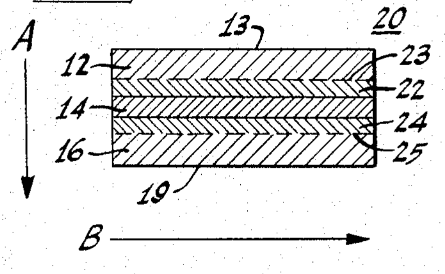

As a result of this bonding step, the assemblage is formed into a single sandwich structure 20 (FIGURE 2). It will be recognized that the process is similar to the surface alloying of a metallic member to a crystalline semiconductive member. The metallic layer 14 while molten, acts as a solvent for the semiconductive layers or dies 12 and 16, and dissolves a portion of the material of each die from the die face adjacent the melt. In this example, the molten layer 14 dissolves a portion of die 12 immediately adjacent die face 15. The molten layer 14 also dissolves a portion of die 16 immediately adjacent die face 17. When the assemblage is cooled to a temperature below the melting point of the metallic layer, the dissolved semiconductive material precipitates before the molten metallic layer is solidified, and the precipitated semiconductive material recrystallizes in the original crystal lattice of the two semiconductive layers immediately adjacent metallic layer 14. Thus a recrystallized zone 22 is formed in semiconductive layer 12 immediately adjacent one face of metallic layer 14, and a similar recrystallized zone 24 is formed in semiconductive layer 16 immediately adjacent the opposing face of metallic layer 14. The recrystallized zones 22 and 24 are doped with the solvent metal, and are also doped with any conductivity modifier which was present in the solvent metal. In this example, zones 22 and 24 are doped with both indium and tellurium. Since tellurium is a donor in indium arsenide, the recrystallized zones 22 and 24 are of N conductivity type. One p-n junction 23 is thus formed between N-type zone 22 and P-type layer 12. Another p-n junction 25 is formed between N-type zone 24 and P-type layer 16.

In the prior art, thermal gradients have been applied to a sandwich structure such as 20 in the direction shown by the arrow "A" (FIGURE 2). This direction may be described as normal to the thickness of the metallic layer 14, or perpendicular to the sandwich plane or interface. Thus according to the prior art, one entire semiconductive layer, for example layer 16, was maintained at a higher temperature than the other entire semiconductive layer 12. At temperatures above the melting point of metallic layer 14, layer 14 assumes the molten state and travels through the hotter semiconductive layer 16 in the direction shown by arrow "A."

In accordance with this invention, the sandwich structure 20 is now treated in a thermal gradient which is applied in the direction shown by the arrow "B" (FIGURE 2). In other words, each of semiconductive layers 12 and 16 is maintained with one end hotter than the other end. This direction of the temperature gradient will be described hereinafter and in the appended claims as parallel to the plane of the sandwich.

Figure 3:
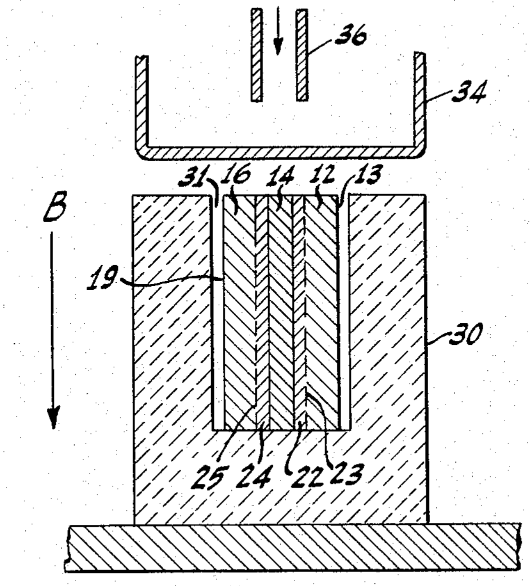

One form of apparatus useful in the practice of the invention is illustrated in FIGURE 3. The apparatus consists of a slab or block 30 of a refractory material, which may, for example, be graphite. Block 30 is provided with a slot or cavity 31 on one side, and on the other side with a heater 32, which may, for example, be an electrical resistance strip heater. The composite sandwich 20 is positioned in cavity 31, so that the sandwich plane is perpendicular to the strip heater 32, that is, one end of layer 14 and each of semiconductive layers 12 and 16 is adjacent to the heater 32, while the other end layer 14 of each of semiconductive layers 12 and 16 is remote from heater 32. A metallic cooling fin 34 is positioned a short distance above the cavity 31 and the sandwich 20. Fin 34 serves as a heat dissipator, and may be cooled by a stream of cold gas which is directed against fin 34 by a jet outlet 36. A non-oxidizing gas such as nitrogen is preferred for this purpose. Instead of fin 34 and jet outlet 36, a water-cooled metallic block, such as a copper block, can be used to cool one end of the sandwich.

By simultaneously energizing the heater 32 and cooling the fin 34, a thermal gradient is impressed across the ends of the sandwich 20. The precise temperature differential is not critical, and may suitably vary from about 10° C. to about 200° C. A temperature difference of about 50° C. is sufficient to move the metallic layer in the sandwich toward the hot side of the apparatus at an acceptable rate. The greater the temperature differential, the more rapid is the movement of the molten metal. In this example, the hot end of sandwich 20 (the end adjacent the heater 32) is maintained at about 750° C., while the cold end of sandwich 20 (the end adjacent the cooled fin 34) is maintained at about 690° C. The entire sandwich is thus at a temperature sufficient to melt the metallic layer 14.

As a result of the temperature gradient, the metallic layer 14 moves toward the hot end of sandwich 20 in the direction shown by arrow "B." After sandwich 20 has thus been heated for about 10 minutes, the metallic layer 14 begins to withdraw from the cold end of sandwich 20 and collects toward the hot end forming an aggregate 14' (FIGURE 4*a*) adjacent the hot end of sandwich 20. At the cooled end of sandwich 20, the two recrystallized tellurium-doped zones 22 and 24 unite to form a single thin heavily-doped low-resistivity central N-type zone 26. As heating in the temperature gradient continues, more of the metallic layer collects as an aggregate 14'' (FIGURE 4*b*) in the hot end of the sandwich, and the central zone 26 increases in length. In this example, sandwich 20 is heated in the thermal gradient parallel to the plane of the sandwich for about 15 hours.

The sandwich 20 is then cooled to room temperature, and that end of the sandwich which was the hot end, and contains the aggregate 14'', is removed. The remainder 20' (FIGURE 5) of the sandwich now consists of a P-type semiconductive layer 12' and a P-type semiconductive layer 16' on opposite sides of a central N-type layer 26, with p–n junctions 23 and 25 between the central layer 26 and the P-type layers.

The PNP structure 20' thus formed is readily fabricated into semiconductor devices such as triode transistors by methods known to the art. One method of accomplishing this is to utilize known photolithographic masking and etching techniques to etch away a peripheral portion of P-type layer 12' and of N-type layer 26, leaving a mesa 61 (FIGURE 6) on one side of sandwich 20''. The other side of sandwich 20'' is ohmically mounted on a central pedestal or boss 66 of a metallic support 67. A metallic electrode 62 is ohmically bonded to the top of mesa 61. A ring-shaped metallic electrode 64 is ohmically bonded to the N-type central region 26 around the mesa 61. Electrical lead wires 63 and 65 are attached to electrodes 62 and 64 respectively. Lead 63 serves as emitter lead, lead 65 serves as the base lead, and support 67 serves as the collector lead of the device. The unit thus fabricated may be encapsulated and cased by standard methods known to the semiconductor art.

In the above example, the metallic layer utilized was an alloy. The metallic layer may also consist of a single metal, as described in the following example.

*Example II*

In this example, the semiconductive layers 12 and 16 consist of P conductivity type monocrystalline indium antimonide, which melts at 525° C. The metallic layer 14 consists of tin, which melts at about 232° C. Tin acts as a donor in indium antimonide.

A sandwich 20 (FIGURE 2) is provided by heating an assemblage consisting of a layer of tin 14 between two layers or dies 12 and 16 of P-type indium antimonide. This heating step is performed in a non-oxidizing ambient at a temperature above the melting point of the tin layer (232° C.) but below the melting point of the indium antimonide layers (525° C.). The three layers may be pressed together during this heating step by means of a clamp or a weight, as described in Example I. In this example, the assemblage is heated at a temperature of about 400° C. for about 5 minutes. During this heating step, the tin melts and dissolves a small portion of semiconductive dies 12 and 16 immediately adjacent the molten tin. On cooling the assemblage to room temperature, sandwich 20 is formed with two N-type tin-doped zones 22 and 24 recrystallized immediately adjacent tin layer 14. One p–n junction 23 is formed between N-type zone 22 and P-type layer 12, and another p–n junction 25 is formed between N-type zone 24 and P-type layer 16.

The sandwich 20 thus formed is reheated in a thermal gradient parallel to the plane of sandwich 20 as illustrated in FIGURE 3 and described in Example I above. In this example, the hot end of sandwich 20 is maintained at about 450° C., and the cold end of the sandwich is maintained at about 280° C. This heating step is performed in a non-oxidizing ambient for about 15 hours. At the end of this time, the central tin layer has moved to the hot end of sandwich 20 as illustrated in FIGURE 4*b*, leaving a high-conductivity central tin-doped N-type indium antimonide zone 26 (formed by the union of zones 22 and 24) between two P-type indium antimonide layers 12 and 16. The subsequent steps of removing that end of the sandwich where the tin has collected, and processing the remainder of the sandwich into a semiconductor junction device such as a mesa transistor, may be accomplished as described above in connection with Example I.

Although the invention has been described above with compound semiconductors as examples, the method is of more general application, and may also be utilized with elemental semiconductors. The device structures fabricated in Examples I and II were both PNP structures, but NPN device structures may also be fabricated. as described in the next example.

*Example III*

In this example, a sandwich is provided by heating an assemblage consisting of an indium layer 14 between two N conductivity type monocrystalline germanium dies 12 and 16 (FIGURE 1). This heating step is performed in an ambient of forming gas (9 volumes nitrogen and 1 volume hydrogen) for about 10 minutes at about 500° C. The molten indium layer 14 dissolves a portion of the two germanium dies. On cooling the assemblage to room temperature, a sandwich 20 (FIGURE 2) is formed having two P-type indium-doped zones 22 and 24 recrystallized immediately adjacent the opposing face of indium layer 14. One p–n junction 23 is formed between P-type zone 22 and N-type layer 12. Another p–n junction 25 is formed between P-type zone 24 and N-type layer 16.

The sandwich 20 thus fabricated is reheated in a thermal gradient parallel to the plane of the sandwich. In this example, one end of the sandwich 20 is maintained at about 700° C., while the other end of the sandwich is maintained at about 550° C. The entire sandwich is thus maintained at a temperature above the melting point of indium (about 157° C.) but below the melting point of germanium (about 958° C.). Suitably, this heating step is performed in a non-oxidizing ambient for about 10 hours. At the end of this time, the central indium layer has moved to the hot end of sandwich 20 as illustrated in FIGURE 4*b*, leaving a thin high-conductivity central indium-doped P-type germanium zone 26 (formed by the union of zones 22 and 24) between two N-type germanium layers 12 and 16. That end of the sandwich where the indium has collected is then removed, and the remainder of the sandwich is processed into a semiconductor junction device such as a triode transistor by techniques similar to those described above in connection with Example I.

In the previous examples, the two semiconductor layers consisted of the same crystalline semiconductive material; the metallic layer included a substance which was a conductivity modifier or doping agent (either an acceptor or a donor) in the semiconductor layers; and the devices fabricated had a structure composed of three different conductivity zones. In the next two examples, the two semiconductor layers consist of two different semiconductive materials; the metallic layer is electrically inert with respect to the semiconductive layers; and the structure formed consists of two different conductivity zones.

*Example IV*

An assemblage consisting of a layer of indium 14 (FIGURE 1) between a P-type monocrystalline indium phosphide wafer 12 and an N-type monocrystalline indium arsenide wafer 16 is positioned in a cavity 11 within a refractory block 10. It will be understood that the conductivity types of wafers 12 and 16 may be reversed, and that the two wafers may also be of the same conductivity type, if desired. The assemblage is heated to a temperature above the melting point of indium (about 157° C.) but below the melting points of indium arsenide and indium phosphide. In this example, the assemblage is heated in a non-oxidizing ambient for about 10 minutes at about 700° C. As mentioned in Example I, a clamp or a weight may be utilized during this step to press the three layers together.

On cooling the assemblage to room temperature, a sandwich 20 (FIGURE 2) is formed having a central indium layer 14, an indium phosphide layer 12 on one side of indium layer 14, and an indium arsenide layer 16 on the other side of indium layer 14. Immediately adjacent the indium layer 14 are two indium-doped zones 22 and 24 extending to depths 23 and 25 respectively. However, the indium in these zones does not affect the conductivity type of the indium phosphide layer 12 or of the indium arsenide layer 16. Hence, in this example, rectifying barriers or p-n junctions are not formed during the fabrication of sandwich 20.

The sandwich 20 is now positioned in a slot 31 (FIGURE 3) of a graphite jig 30 so that one end of the indium layer 14 and of the semiconductor layers 12 and 16 is adjacent a heat source 32 and remote from a heat dissipator 34, while the other end of indium layer 14 and semiconductor layers 12 and 16 is adjacent the heat dissipator 34 and remote from heat source 32. Sandwich 20 is now reheated at a temperature above the melting point of indium but below the melting point of indium phosphide and indium arsenide while maintaining a thermal gradient across the ends of the sandwich. In this example, the hot end of the sandwich is maintained at about 750° C., while the cold end of the sandwich is maintained at about 500° C.

Figure 4A:
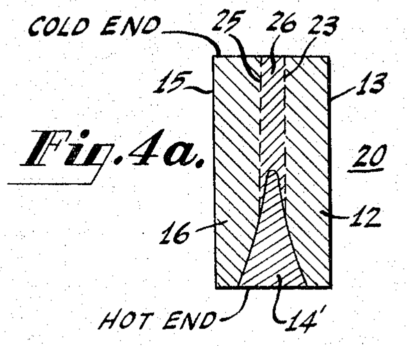
Figure 4B:
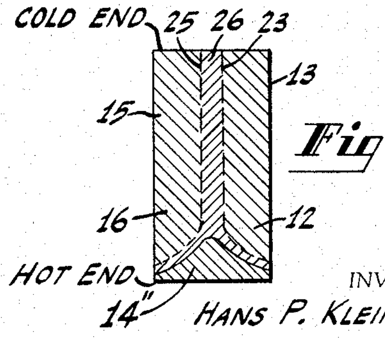
Figure 6:
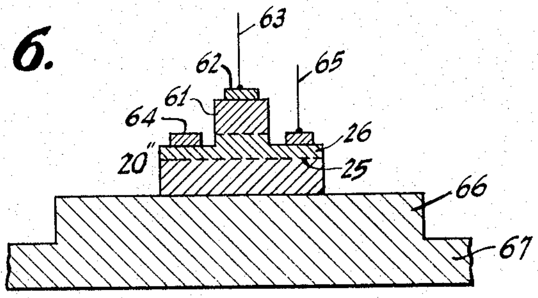

Under the influence of the thermal gradient, the indium layer 14 moves to the hot end of sandwich 20, and assumes the shapes 14' and 14'', as illustrated in FIGURES 4*a* and 4*b* respectively. The two indium-doped regions 22 and 24 unite to form a single mixed layer 26 consisting of an alloy of indium-doped indium phosphide and indium-doped indium arsenide.

Figure 5:
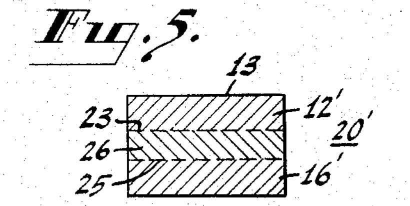

Sandwich 20 is cooled to room temperature. The end of sandwich 20 where the indium has collected is removed, leaving the sandwich remainder 20' as illustrated in FIGURE 5. Since indium phosphide layer 12' is P-type, and indium arsenide layer 16' is N-type, the mixed central layer 26 acts as a transition region between semiconductive layers 12' and 16'. The sandwich 20' may be utilized to fabricate a semiconductor device. For example, a semiconductor diode may be made by attaching one electrical lead wire (not shown) to the indium phosphide layer 12', and another electrical lead wire (not shown) to the indium arsenide layer 16'. The techniques for attaching lead wires to semiconductors, for example, by thermal compression bonding or by soldering, and subsequently encapsulating and casing the device, are well known to the semiconductor art, and need not be described here.

*Example V*

An assemblage consisting of a layer of gallium 14 (FIGURE 1) between a P-type monocrystalline gallium arsenide wafer 12 and an N-type monocrystalline gallium phosphide wafer 16 is positioned in a cavity 11 within a refractory block 10. The assemblage is heated to a temperature above the melting point of gallium (about 30° C.) but below the melting points of gallium arsenide and gallium phosphide. In this example, the assemblage is heated in a non-oxidizing ambient for about 10 minutes at about 800° C.

On cooling the assemblage to room temperature, a sandwhich 20 (FIGURE 2) is formed having a central gallium layer 14, a P-type gallium arsenide layer 12 on one side of gallium layer 14, and an N-type gallium phosphide layer 16 on the other side of gallium layer 14. Immediately adjacent the gallium layer 14 are two gallium-doped zones 22 and 24 extending to depths 23 and 25 respectively. However, the gallium in these zones does not affect the conductivity type of the gallium arsenide layer 12 or of the gallium phosphide layer 16. Hence, in this example, rectifying barriers are not formed during the fabrication of sandwich 20.

The sandwich 20 is now positioned in a slot 31 (FIGURE 3) of a jig 30 so that one end of the gallium layer 14 and of the semiconductor layers 12 and 16 is adjacent a heating source 32 and remote from a heat dissipator 34, while the other end of gallium layer 14 and semiconductor layers 12 and 16 is adjacent the heat dissipator 34 and remote from heat source 32. Sandwich 20 is reheated for about 10 hours in a non-oxidizing ambient at a temperature above the melting point of gallium but below the melting point of gallium arsenide and gallium phosphide while maintaining a thermal gradient across the ends of the sandwich. In this example, the hot end of the sandwich is maintained at about 900° C. while the cold end of the sandwich is maintained at about 700° C.

Under the influence of the thermal gradient, the gallium layer 14 moves to the hot end of sandwich 20, and assumes the shapes 14' and 14'', as illustrated in FIGURES 4*a* and 4*b* respectively. The two gallium-doped regions 22 and 24 unite to form a sinlgle mixed layer 26 consisting of an alloy of gallium-doped gallium arsenide and gallium-doped gallium phosphide.

Sandwich 20 is cooled to room temperature. The end of sandwich 20 where the gallium has collected is removed, leaving the sandwich remainder 20' as illustrated in FIGURE 5. Since gallium arsenide layer 12' is P-type and gallium phosphide layer 16' is N-type, the mixed central layer 26 acts as a transition region between semiconductive layers of opposite conductivity types. The sandwich remainder 20' may be utilized to fabricate a semiconductor device such as a diode, using techniques similar to those mentioned in connection with Example IV.

In the previous examples, only a single metallic layer and only two semiconductive layers are utilized. In the following example, a plurality of metallic layers and semiconductive layers are utilized.

*Example VI*

An assemblage is prepared consisting of a plurality of semiconductive layers 72, 74, 76 and 78 (FIGURE 7) and a plurality of metal layers 73, 75 and 77, so that each metallic layer is between a pair of semiconductive layers, and is in contact with said pair of semiconductive layers. In this example, the assemblage consists of a P-type germanium wafer 72; an N–type germanium wafer 74; a P-type germanium wafer 76; and an N-type germanium wafer 78. The metallic layers 73, 75 and 77 consist of lead in this example. Lead layer 73 is between germanium wafer 73 and 74; lead layer 75 is between germanium wafer 74 and 76; and lead layer 77 is positioned between germanium wafers 76 and 78. The assemblage is positioned in a cavity 11 in a refractory block 10, and heated in a non-oxidizing ambient to a temperature above the melting point of lead (328° C.) but below the melting point of germanium (about 959° C.). In this example, the assemblage is heated in a forming gas ambient for about 10 minutes at about 500° C.

On cooling the assemblage to room temperature, a sandwich 80 (FIGURE 8) is formed consisting of alternate layers of germanium and lead. Those portions of the germanium layers 72, 74, 76 and 78 which are immediately adjacent lead layers 73, 75 and 77 contain lead, but since lead is not a doping agent (i.e., neither an acceptor nor a donor) in germanium, the conductivity type of the germanium layers is not affected thereby. Since these lead-containing regions of the germanium do not play an active role in the device of this example, they are omitted from the drawing for greater clarity.

The sandwich 80 thus prepared is treated in a thermal gradient parallel to the plane of the sandwich in a manner similar to that described in Example I and illustrated in FIGURE 3. In this example, one end of sandwich 80 is maintained at 750° C. and the other end of sandwich 80 is maintained at 650° C. for about 10 hours.

Under the influence of the thermal gradient, the lead layers 73, 75 and 77 all move to the hot end of the sandwich 80 and collect at that end in a mass 79 (FIGURE 9). A p-n junction 91 is formed between P-type layer 72 and N-type layer 74; a second junction 92 is formed between N-type layer 74 and P-type layer 76; and a third junction 93 is formed between P-type layer 76 and N-type layer 78. The lead-containing end of sandwich 80 is now removed, and the remainder of the sandwich is utilized to fabricate semiconductor junction devices. For example, by attaching one electrical lead to the P-type layer 72, and attaching another electrical lead to the N-type layer 78, a PNPN diode may be formed. Standard techniques for attaching the lead wires and for encapsulating and casing the device may be utilized for this purpose.

The above examples are by way of illustration only, and not limitation. Any of the standard crystalline semiconductive materials and appropriate acceptors or donors may be utilized, together with a central metallic layer which has a melting point lower than that of the semiconductor, and is capable, when molten, of dissolving at least a small portion of the semiconductor. Other crystalline semiconductors which may be utilized are those known as the II–VI compounds, consisting of the sulfides, selenides and tellurides of zinc and cadmium. Appropriate acceptors for these semiconductors are elements of Group I of the Periodic Table, and appropriate donors are elements of Group VII of the Periodic Table. The metallic layer may include lead tin, silver, gallium, bismuth, thallium, and the like. Various other modifications may be made without departing from the spirit and scope of the invention as set forth in the specification and appended claims.

What is claimed is:

1. The method of fabricating a semiconductor device comprising:

forming a sandwich consisting of a metallic layer between two semiconductor layers, said metallic layer having a melting point lower than the melting point of said two semiconductor layers and being capable, when molten, of dissolving a portion of said semiconductor layers;

maintaining a temperature differential between two ends of said sandwich to establish a temperature gradient parallel to the plane of said sandwich while heating said sandwich to a temperature above the melting point of said metallic layer but below the melting point of said semiconductor layers, said heating step being performed for a period of time sufficient for said metallic layer to collect at the hot end of said sandwich; and cooling said sandwich to room temperature to bond said two semiconductor layers.

2. The method of fabricating a semiconductor device comprising:

forming a sandwich consisting of a metallic layer bonded between two semiconductor layers, said metallic layer having a melting point lower than that of said two semiconductor layers and being capable, when molten, of dissolving a portion of said semiconductor layers;

maintaining a temperature differential between two ends of said sandwich to establish a temperature gradient parallel to the plane of said sandwich while heating said sandwich to a temperature above the melting point of said metallic layer but below the melting point of said semiconductor layers, said heating step being performed for a period of time sufficient for said metallic layer to collect at the hot end of said sandwich;

cooling said sandwich to room temperature; and removing that end of said sandwich in which said metallic layer has collected.

3. The method of fabricating a semiconductor device comprising:

positioning two layers of crystalline semiconductive material against opposing faces of a metallic layer, said metallic layer having a melting point lower than the melting point of sid two semiconductive layers and comprising a substance which is a conductivity type modifier in said semiconductive material;

heating the assemblage of said two semiconductive layers and said metallic layer to a temperature sufficient to bond said three layers into a sandwich;

and reheating said sandwich to a temperature above the melting point of said metallic layer but below the melting point of said semiconductor layers while maintaining a temperature differential between two ends of said sandwich to establish a temperature gradient parallel to the plane of said sandwich, said reheating step being performed for a period of time sufficient for said metallic layer to collect at the hot end of said sandwich.

4. The method of fabricating a semiconductor device comprising:

positioning two layers of crystalline semiconductive material against opposing faces of a metallic layer, said metallic layer having a melting point lower than that of said two semiconductive layers and comprising a substance which is a conductivity type modifier in said semiconductive material;

heating the assemblage of said two semiconductive layers and said metallic layer to a temperature sufficient to bond said three layers into a sandwich;

reheating said sandwich to a temperature above the melting point of said metallic layer but below the melting point of said semiconductor layers while maintaining a temperature differential between two ends of said sandwich to establish a temperature gradient parallel to the plane of said sandwich, said reheating step being performed for a period of time sufficient for said metallic layer to collect at the hot end of said sandwich;

and cooling said sandwich to room temperature.

5. The method of fabricating a semiconductor device comprising:

positioning two layers of crystalline semiconductive material against opposing faces of a metallic layer, said metallic layer having a melting point lower than that of said two semiconductive layers and comprising a substance which is a conductivity type modifier in said semiconductive material;

heating the assemblage of said two semiconductive layers and said metallic layer to a temperature sufficient to bond said three layers into a sandwich;

reheating said sandwich to a temperature above the melting point of said metallic layer but below the melting point of said semiconductor layers while maintaining a temperature differential between two ends of said sandwich to establish a temperature gradient parallel to the plane of said sandwich, said reheating step being performed for a period of time sufficient for said metallic layer to collect at the hot end of said sandwich;

cooling said sandwich to room temperature;

and removing that end of the sandwich in which said metallic layer has collected.

6. The method of fabricating a semiconductor device comprising:

positioning two layers of crystalline semiconductive material against opposing faces of a metallic layer, said metallic layer having a melting point lower than that of said two semiconductor layers and comprising a substance which is a conductivity modifier in said semiconductive material;

heating the assemblage of said two semiconductive layers and said metallic layer to a temperature sufficient to bond said three layers into a sandwich;

cooling said sandwich to room temperature;

reheating said sandwich to a temperature above the melting point of said metallic layer but below the melting point of said semiconductor layers while maintaining a temperature differential between two ends of said sandwich to establish a temperature gardient parallel to the plane of said sandwich, said reheating step being performed for a period of time suffiicent for said metallic layer to collect at the front end of said sandwich;

cooling said sandwich to room temperature;

and removing that end of the sandwich in which said metallic layer has collected.

7. The method of fabricating a semiconductor device comprising:

positioning two layers of given conductivity type crystalline semiconductive material against opposing faces of a metallic layer, said metallic layer having a melting point lower than that of said two semiconductive layers and comprising a substance capable of inducing opposite conductivity type in said semiconductive material;

heating the assemblage of said two semiconductive layers and said metallic layer to a temperature sufficient to bond said three layers into a sandwich;

cooling said sandwich to room temperature;

reheating said sandwich to a temperature above the melting point of said metallic layer but below the melting point of said semiconductor layers while maintaining a temperature differential between two ends of said sandwich to establish a temperature gradient parallel to the plane of said sandwich, said reheating step being performed for a period of time sufficient for said metallic layer to collect at the hot end of said sandwich;

cooling said sandwich to room temperature;

and removing that end of the sandwich in which said metallic layer has collected.

8. The method of fabricating a semiconductor device comprising:

positioning two layers of P-conductivity type crystalline indium arsenide against opposing faces of a metallic layer comprising 90 atomic percent indium and 10 atomic percent tellurium;

heating the assemblage of said two indium arsenide layers and said indium-tellurium layer to a temperature sufficient to bond said three layers into a sandwich;

cooling said sandwich to room temperature;

reheating said sandwich to a temperature above the melting point of said indium-tellurium layer but below the melting point of said indium arsenide layers while maintaining a temperature differential between two ends of said sandwich to establish a temperature gradient parallel to the plane of said sandwich, said reheating step being performed for a period of time sufficient for said indium-tellurium layer to collect at the hot end of said sandwich;

cooling said sandwich to room temperature;

and removing that end of the sandwich in which said indium-tellurium layer has collected.

9. The method of fabricating a semiconductor device comprising:

positioning two layers of P-conductivity type crystalline indium antimonide against opposing faces of a layer of tin;

heating the assemblage of said two indium antimonide layers and said tin layer to a temperature sufficient to bond said three layers into a sandwich;

cooling said sandwich to room temperature;

reheating said sandwich to a temperature above the melting point of tin but below the melting point of indium antimonide while maintaining a temperature differential between two ends of said sandwich to establish a temperature gradient parallel to the plane of said sandwich, said reheating step being performed for a period of time sufficient for said tin layer to collect at the hot end of said sandwich;

cooling said sandwich to room temperature;

and removing that end of the sandwich in which said tin layer has collected.

10. The method of fabricating a semiconductor device comprising:

forming a sandwich consisting of a metallic layer bonded between two semiconductor layers, said two semiconductor layers being composed of two different crystalline semiconductive materials, said metallic layer having a melting point lower than the melting point of said two semiconductor layers and being capable, when molten, of dissolving a portion of said semiconductor layers;

maintaining a temperature differential between two ends of said sandwich to establish a temperature gradient parallel to the plane of said sandwich while heating said sandwich to a temperature above the melting point of said metallic layer but below the melting point of said semiconductor layers, said heating step being performed for a period of time sufficient for said metallic layer to collect at the hot end of said sandwich.

11. The method of fabricating a semiconductor device comprising:

forming a sandwich consisting of a metallic layer bonded between two semiconductor layers, said two semiconductor layers being composed of two different crystalline semiconductive materials and having opposite conductivity types, said metallic layer having a melting point lower than the melting point of said two semiconductor layers and being capable, when molten, dissolve a portion of said semiconductor layers;

maintaining a temperature differential between two ends of said sandwich to establish a temperature gradient parallel to the plane of said sandwich while heating said sandwich to a temperature above the melting point of said metallic layer but below the melting point of said semiconductor layers, said heating step being performed for a period of time sufficient for said metallic layer to collect at the hot end of said sandwich;

cooling said sandwich to room temperature; and removing that end of said sandwich in which said metallic layer has collected.

12. The method of fabricating a semiconductor device comprising:

positioning one layer of indium antimonide and another layer of indium phosphide against opposing faces of a layer of indium;

heating the assemblage of said three layers to a temperature sufficient to bond said three layers into a sandwich;

cooling said sandwich to room temperature;

reheating said sandwich to a temperature above the melting point of indium but below the melting points of indium antimonide, and indium phosphide while maintaining a temperature differential between two ends of said sandwich to establish a temperature gradient parallel to the plane of said sandwich, said reheating step being performed for a period of time sufficient for said indium layer to collect at the hot end of said sandwich;

cooling said sandwich to room temperature; and removing that end of said sandwich in which said indium layer has collected.

13. The method of fabricating a semiconductor device comprising:

positioning one layer of gallium phosphide and another layer of gallium arsenide against opposing faces of a layer of gallium;

heating the assemblage of said three layers to a temperature sufficient to bond said three layers into a sandwich;

cooling said sandwich to room temperature;

reheating said sandwich to a temperature above the melting point of gallium but below the melting points of gallium phosphide and gallium arsenide while maintaining a temperature differential between two ends of said sandwich to establish a temperature gradient parallel to the plane of said sandwich, said reheating step being performed for a period of time sufficient for said gallium layer to collect at the hot end of said sandwich;

cooling said sandwich to room temperature; and removing that end of said sandwich in which said gallium layer has collected.

14. The method of fabricating a semiconductor device comprising:

forming a sandwich consisting of a plurality of metallic layers and a plurality of semiconductor layers, each said metallic layer being between a pair of semiconductor layers, said metallic layers having a melting point lower than that of said semiconductor layers and being capable, when molten, of dissolving a portion of said semiconductor layers;

maintaining a temperature differential between two ends of said sandwich to establish a temperature gradient parallel to the plane of said sandwich while heating said sandwich to a temperature above the melting point of said metallic layers but below the melting point of said semiconductor layers, said heating step being performed for a period of time sufficient for said metallic layers to collect at the hot end of said sandwich;

cooling said sandwich to room temperature; and removing that end of said sandwich in which said metallic layers have collected.

References Cited by the Examiner

UNITED STATES PATENTS 2,701,326 2/1955 Pfann ---------------- 148—186

HYLAND BIZOT, *Primary Examiner.*